March 26, 1957 D. BLITZ 2,786,969

ELECTRONIC MODULE STRUCTURE

Filed Jan. 28, 1954 2 Sheets-Sheet 1

Daniel Blitz
*INVENTOR.*

*BY* [signature]

ATTORNEY

March 26, 1957 D. BLITZ 2,786,969

ELECTRONIC MODULE STRUCTURE

Filed Jan. 28, 1954 2 Sheets-Sheet 2

Daniel Blitz
*INVENTOR.*

*BY* [signature]

ATTORNEY

United States Patent Office 2,786,969

Patented Mar. 26, 1957

2,786,969

ELECTRONIC MODULE STRUCTURE

Daniel Blitz, Boston, Mass., assignor to Sanders Associates, Incorporated, Nashua, N. H.

Application January 28, 1954, Serial No. 406,684

8 Claims. (Cl. 317—101)

This invention relates to electronic apparatus, its elements and components, and to the manufacture and assembly thereof.

The invention is especially useful in systems for mechanized production of electronic apparatus. It uses wafer and riser members in structures known as modules. Circuit components assembled into such modules provide an extremely large variety of arrangements and are effectually building blocks of complete electronic devices. By their use high speed-automatic production becomes feasible and extremely economical, and precise and highly compact components are made available.

It is an object of the present invention to provide an improved module of the character described.

It is a further object of the invention to provide an improved module of the character described which is of extremely economical design, light-weight, rugged construction and relatively easy to fabricate.

It is a further object of the invention to provide a module of the character described which is especially adapted for manufacture by mass production methods.

Other and further objects of the invention will be apparent from the following detailed description of a typical embodiment thereof, taken in connection with the accompanying drawings.

In accordance with the present invention there is provided a composite, electric-component module. The module comprises a plurality of wafer elements having flat, component-supporting surfaces and riser members having angularly extending edges with the edges of one riser member adjacent the edges of another of said riser members and providing a single, one-piece, box-shaped module structure with the wafer elements disposed between adjacent riser members. Circuit components are carried by the supporting surfaces, and electrically conductive paths are provided on the surfaces of the wafer elements and on the riser members, providing selective electrical connections for the components. The wafer elements and riser members are preferably of paper or paper-like material making for an extremely economical, light-weight, rugged construction and easy-to-fabricate structure.

Figure 1:
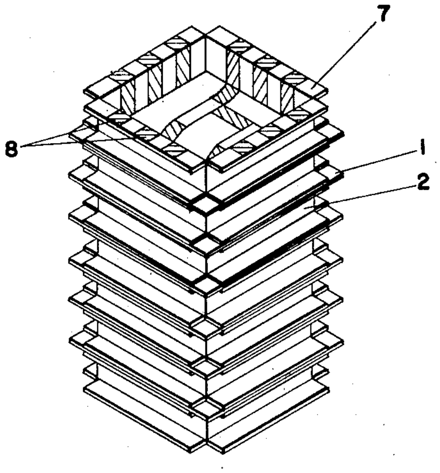
Fig. 1 is an isometric view of a composite, electric-component module embodying the present invention.
Figure 2:
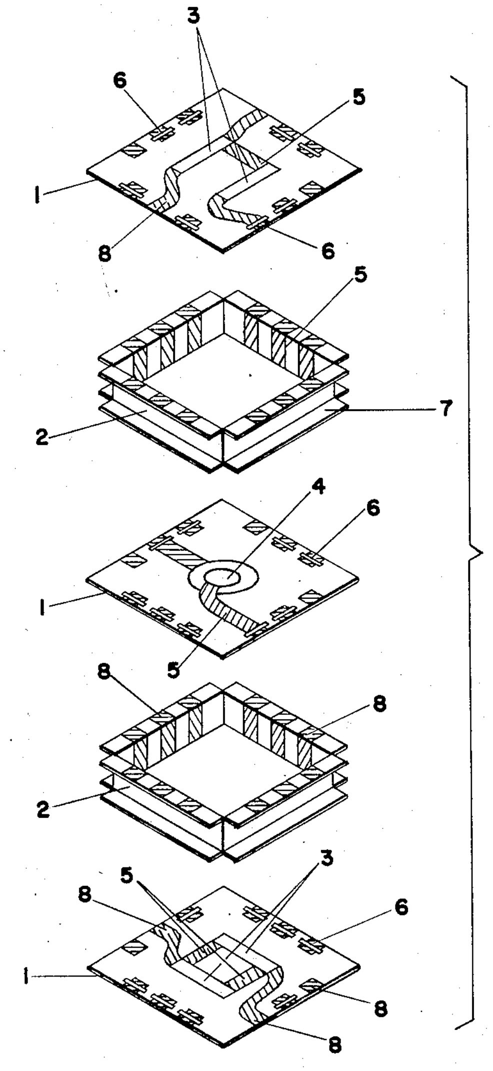
Fig. 2 is an exploded, isometric view of elements included in the embodiment of Fig. 1.

Referring now in more detail to the drawings, in Fig. 1 the preferred embodiment of the invention illustrated comprises a plurality of wafer elements 1 and riser members 2, which are shown separately in Fig. 2.

Attached to the wafer elements, preferably both top and bottom surfaces, are electric-circuit components as exemplified by the resistors 3 and capacitors 4, with conductive material applied with the usual printed circuit technique, as indicated at 5. Apertures 6 are formed on the wafer elements along their edges as shown. Conductive connections are shown cross-hatched.

Riser members 2, of box-shaped construction, are provided, as shown, with angularly extending edges 7. The riser members are arranged one above the other with the edges of one riser member adjacent the edges of another to provide a single, one-piece, box-shaped module structure with the wafer elements disposed between adjacent riser members, as shown. Electrical conductive paths 5 comprising suitable conductive material are provided on the surfaces of the wafer elements and the inner surfaces of the riser elements as well as in the apertures 6, to provide selective electrical connections for the various components, as shown. A suitable conductive adhesive is employed for securing the wafer elements and the riser members at the contact surfaces 8. This adhesive may form an integral part of the conductive material.

Figure 3:
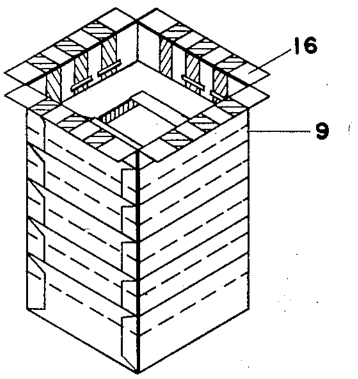
Fig. 3 is an isometric view of a module embodying a modified form of the invention.
Figure 4:
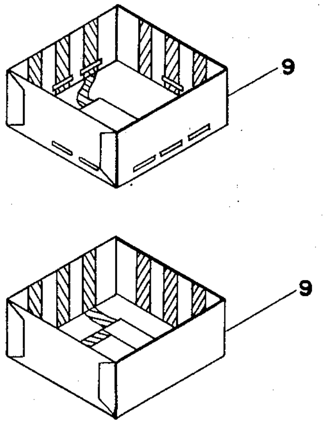
Fig. 4 illustrates two of the wafer elements and combined riser structures of the embodiment of Fig. 3.
Figure 5:
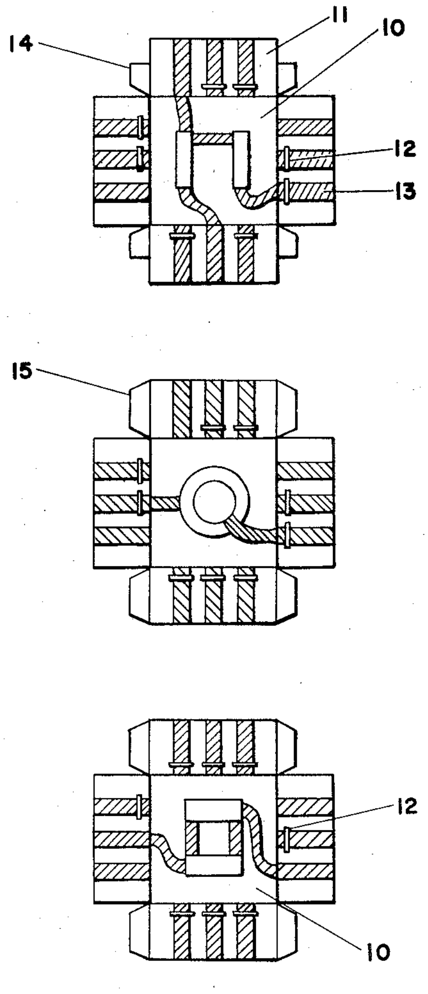
Fig. 5 is a plan view of a wafer-riser structure before assembly, showing electric components attached to the wafer surfaces.

The modified form of the invention shown in Fig. 3 comprises a plurality of box-shaped, wafer elements 9 having flat, component-supporting surfaces 10 and side members 11 angularly extending from the edges of the surfaces. These box-shaped, wafer elements are so dimensioned, with each successive element of increased width, that one element fits within another; that is, the side members of one wafer element extend into the side members of an adjacent element. There is, thereby, provided a one-piece, box-shaped, module structure. In the apertures 12 and paths 13, adhesive and conductive material are provided in a manner similar to that described with reference to the embodiment of Fig. 1. The apertures 12 and paths 13 thus provide selective electrical connections for the components carried by the wafer elements. The wings 15 extend from the side members 11, as shown. The wings 14 in the uppermost wafer element are cut away, as shown, to permit a portion to be outwardly bent, as indicated at 16 in Fig. 3. Again the module structure is preferably made of paper or a suitable paper-like material.

By virtue of the provision of the paper module as described, there is provided an extremely effective building block for electronic devices. The units of Figs. 1 or 3 may be provided as a complete electronic system. A wafer may be added at the bottom, carrying components and connections only on the top surface of the wafer. A second wafer, to which may be affixed a tube socket, may be added to the top of the modules. Connections to the tube socket will be carried on the underside of that wafer. The outside surface of the completed unit constructed in the manner described would be entirely insulated electrically from the circuitry inside.

By use of such modules high speed, automatic production becomes feasible and practicable, and precise, light-weight, highly compact, composite component assemblies, which are most economical in design, rugged in construction and relatively easy to fabricate, are made available.

While there has been hereinbefore described what is, at present, considered a preferred embodiment of the invention, it will be apparent to those skilled in the art that many and various changes and modifications may be made with respect to the embodiment illustrated without departing from the spirit of the invention. It will be understood, therefore, that all those changes and modifications, as fall fairly within the scope of the appended claims, are to be considered as a part of the present invention.

What is claimed is:

1. A composite electric-component module, comprising: a plurality of wafer elements having flat, component-supporting surfaces; riser members having angularly extending edges, the edges of one riser member being adjacent the edges of another of said riser members and providing a single, one-piece, box-shaped module structure with said wafer elements disposed between adjacent riser members; circuit components carried by said supporting surfaces; and electrically conductive paths provided on said surfaces and riser members providing selective electrical connections for said components.

2. A composite, electric-component module, comprising: a plurality of wafer elements having flat, component-supporting surfaces, openings formed in selected positions in said elements; riser members having angularly extending edges, the edges of one riser member being adjacent the edges of another of said riser members and providing a single, one-piece, box-shaped module structure with said wafer elements disposed between adjacent riser members; circuit components carried by said supporting surfaces; and electrically conductive paths provided on said surfaces through said openings and on said riser members providing selective electrical connections for said components.

3. A composite, electric-component module, comprising: a plurality of paper-like wafer elements having flat, component-supporting surfaces; paper-like riser members having angularly extending edges, the edges of one riser member being adjacent the edges of another of said riser members and providing a single, one-piece, box-shaped module structure with said wafer elements disposed between adjacent riser members; circuit components carried by said supporting surfaces; and electrically conductive paths provided on said surfaces and side members providing selective electrical connections for said components.

4. A composite, electric-component module, comprising: a plurality of wafer elements having flat, component-supporting surfaces with openings at selected positions along their edges; substantially box-shaped, riser members having vertical side members and angularly extending edges, with the edges of adjacent riser members secured together and providing a single, one-piece, box-shaped module structure with said wafer element between the edges of adjacent riser elements; circuit components carried by said wafer elements; and electrically conductive paths provided on said surfaces and the inner surfaces of side members providing selective electrical connections for said components.

5. A composite, electric-component module, comprising: a plurality of box-shaped, wafer elements having component-supporting surfaces and side members angularly extending from edges of said surfaces, the side members of one wafer element extending into the side members of an adjacent element and providing a single, one-piece, box-shaped module structure; circuit components carried by said supporting surfaces; and electrically conductive paths provided on said surfaces and side members providing selective electrical connections for said components.

6. A composite, electric-component module comprising: a plurality of wafer elements having flat, component-supporting surfaces and side members angularly extending from edges of said surfaces, the side members of one wafer element extending into the side members of an adjacent element, and providing a one-piece, box-shaped, module structure; a plurality of openings formed in said side members; circuit components carried by said supporting surfaces; electrically conductive paths provided on said surfaces and side members; and conductive material disposed in said openings and, together with said paths, providing selective electrical connections for said components.

7. A composite, electric-component module, comprising: a plurality of wafer elements having flat, component-supporting surfaces and side members angularly extending from edges of said surfaces, the side members of one wafer element extending into the side members of an adjacent element and providing a one-piece, box-shaped, module structure; circuit components carried by said supporting surfaces; a plurality of openings formed in selected positions in said side members; and electrically conductive paths provided on said surfaces and on the inner surfaces of side members and extending through said openings, providing selective electrical connections for said components.

8. A composite, electric-component module, comprising: a plurality of paper-like, wafer elements having flat, component-supporting surfaces and side members angularly extending from edges of said surfaces to provide box-shaped elements, the side members of one wafer element extending into the side members of an adjacent element, and providing a single, one-piece, box-shaped, paper-like, module structure; circuit components carried by said supporting surfaces; and electrically conductive paths provided on said surfaces and side members providing selective electrical connections for said components.

References Cited in the file of this patent

UNITED STATES PATENTS

| | | |
|---|---|---|
| 2,226,745 | Schrack | Dec. 31, 1940 |
| 2,262,791 | Bransford | Nov. 18, 1941 |
| 2,441,960 | Eisler | May 25, 1948 |
| 2,474,988 | Sargrove | July 5, 1949 |

FOREIGN PATENTS

| | | |
|---|---|---|
| 357,171 | Great Britain | Sept. 10, 1931 |

OTHER REFERENCES

Electronics of August 1953, pages 205 and 206 (an article on Solderless Component Assembly).